United States Patent [19]

Doong

[11] Patent Number: 5,747,803
[45] Date of Patent: May 5, 1998

[54] METHOD FOR PREVENTING CHARGING EFFECT AND THERMAL DAMAGE IN CHARGED-PARTICLE MICROSCOPY

[75] Inventor: Yih-Yuh Doong, Kaoshsiung, Taiwan

[73] Assignee: United Microelectronics Corporation, Taiwan

[21] Appl. No.: 789,626

[22] Filed: Jan. 27, 1997

[30] Foreign Application Priority Data

Nov. 26, 1996 [TW] Taiwan .................. 85114622

[51] Int. Cl.⁶ .................................. H01J 37/26
[52] U.S. Cl. .................... 250/307; 250/310; 324/751; 382/147
[58] Field of Search .................... 250/307, 306, 250/310, 309, 311, 492.2; 324/751; 382/145, 147, 149

[56] References Cited

U.S. PATENT DOCUMENTS 5,369,274 11/1994 Brünger .................... 250/307

Primary Examiner—Kiet T. Nguyen
Attorney, Agent, or Firm—Rabin, Champagne & Lynt, P.C.

[57] ABSTRACT

A method is provided for inspecting an integrated circuit chip by use of a charged-particle microscope, such as an electron or ion-beam microscope, without incurring charge effect and thermal damage to the chip. Fundamentally, the method features the forming of a coating of good electrical and heat conductive material on the back of the target portion such that the charged particles from the microscope, after passing through the target portion, will encounter the coating of good electrical and heat conductive material and thus be drawn away by the same. As a result of this, the adverse consequences of charge effect and thermal damage can be prevented. This also allows for an increase in the resolution of the resultant image of the inspected chip.

8 Claims, 3 Drawing Sheets

METHOD FOR PREVENTING CHARGING EFFECT AND THERMAL DAMAGE IN CHARGED-PARTICLE MICROSCOPY

BACKGROUND OF THE INVENTION

1. Field of the Invention

This invention relates to microscopy for the inspection of integrated circuits, and more particularly, to a method for preventing charging effect and thermal damage in microscopes which employ a beam of charged particles, such as electrons or ions, for inspecting the fine internal chip structures of integrated circuits.

2. Description of Related Art

Integrated circuits are customarily inspected during the quality control process by using a microscope which uses a charged-particle beam, such as an electron beam or an ion beam, as the illuminating means to form an image of the sample being inspected. Microscopes for this purpose includes scanning-electron microscope (SEM), transmission-electron microscope (TEM), scanning-Auger microscope (SAM), and the focused ion-bean (FIB) microscope. These microscopes are collectively referred to as "charged-particle microscope" hereinafter in this specification. Fundamentally, a charged-particle microscope employs a beam of charged particles, such as electrons or ions, which are focused electronically on the sample under inspection such that the emerging beam forms an image of the sample being inspected.

Theoretically, the resolution of the image formed by a charged-particle microscope is increased as the charged-particle beam is increased in kinetic energy. However, when the charged-particle beam is increased to an energy of 20 KeV (kiloelectronvolts), the charged-particle beam causes the adverse consequences of charge effect and thermal damage to the sample, thus impairing the integrated circuit on the sample.

Three conventional methods are proposed as solutions to this problem: (1) forming a coating of good electrical and heat conductive material over the surface of the sample under inspection; (2) operating the charged-particle microscope with a low-energy beam; and (3) in the case of SEM, applying a beam of positive ions to the sample; and in the case of FIB, applying a beam of electrons to the same, so as to neutralize the charges on the sample.

Conventional methods for forming a coating of good electrical and heat conductive material over the surface of the sample include: (1) a surface-coating technique, which employs a vacuum evaporation or sputtering process to do the coating, widely utilized in electron microscopy and analytic laboratories; (2) a dying technique, in which the sample is first exposed in osmium oxide vapor or treated in a fixative solution of osmium or magnesium, and then dyed with a metallorganic compound so as to form the coating; (3) a thin-film technique, in which an organic fixative solution of polyamide derivative is sprayed on the sample or is used as a bath into which the sample is immersed so as to form a coating of noble metal or graphite with a thickness of about 1.0 to 20.0 nm (nanometers) which serves as the desired coating of good electrical and heat conductive material.

These methods, however, are not suitable for use on certain types of integrated circuits having a top surface, for example an insulating layer on the top surface of the chip, that can be affected by the coating of good electrical and heat conductive material. Moreover, they are only suited for use in laboratories at research and development sites and not suited for use on mass production lines.

SUMMARY OF THE INVENTION

It is therefore a primary objective of the present invention to provide a method for use on a charged-particle microscope to prevent charging effect and thermal damage to the sample under inspection by the high-energy charged-particle beam.

It is another objective of the present invention to allow the foregoing method to be applicable on mass production lines and elsewhere.

In accordance with the foregoing and other objectives of the present invention, a new method for preventing charging effect and thermal damage resulting from use of a charged-particle microscope to inspect integrated circuit is provided.

Fundamentally, the method of the invention features the formation of a coating of electrical and heat conductive material on the back of the target portion of the sample such that the charged particles from the microscope, after passing through the target portion, will encounter the coating of good electrical and heat conductive material and thus be drawn away by the same without incurring the adverse consequences of charging effect and thermal damage to the chip. This also allows for an increase in the resultant of the resulted image of the inspected sample.

Two embodiments of the method of the invention are disclosed. The first embodiment (hereinafter referred to as the off-line embodiment in this specification) is suitable for inspection of IC chips at those sites other than a mass production line where clean rooms are not available; and the second embodiment (hereinafter referred to as the off-line/on-line embodiment in this specification) is suitable for inspection of IC chips at any sites.

The off-line embodiment of the method of the invention includes a first step of cutting a portion of the chip as a sample; a second step of outlining a target area on the sample; a third step of forming a cavity beneath the target area; a fourth step of forming a coating of electrical and heat conductive material on the top wall of the cavity; and a fifth step of orienting the sample in such a manner as to allow the charged-particle beam from the microscope to strike the target area and subsequently encounter the coating of electrical and heat conductive material on the top wall of the cavity beneath the target area, thereby allowing the charges to be drawn away by the coating of electrical and heat conductive material.

The on-line/off-line embodiment of the method of the invention includes a first step of obtaining a sample of the chip; a second step of defining a target portion on the sample; a third step of forming a pair of hollowed portions on both sides of the target portion; a fourth step of forming a coating of electrical and heat conductive material on the second sidewall of the target portion; and a fifth step of orienting the sample by a predetermined angle with respect to the charged-particle beam from the microscope in such a manner as to allow the charged-particle beam to strike the first sidewall of the target portion and subsequently encounter the coating of electrical and heat conductive material on the second sidewall of the target portion, thereby allowing the charges to be drawn away by the coating of electrical and heat conductive material.

BRIEFS DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

First Preferred Embodiment (Off-line)

Figure 1:
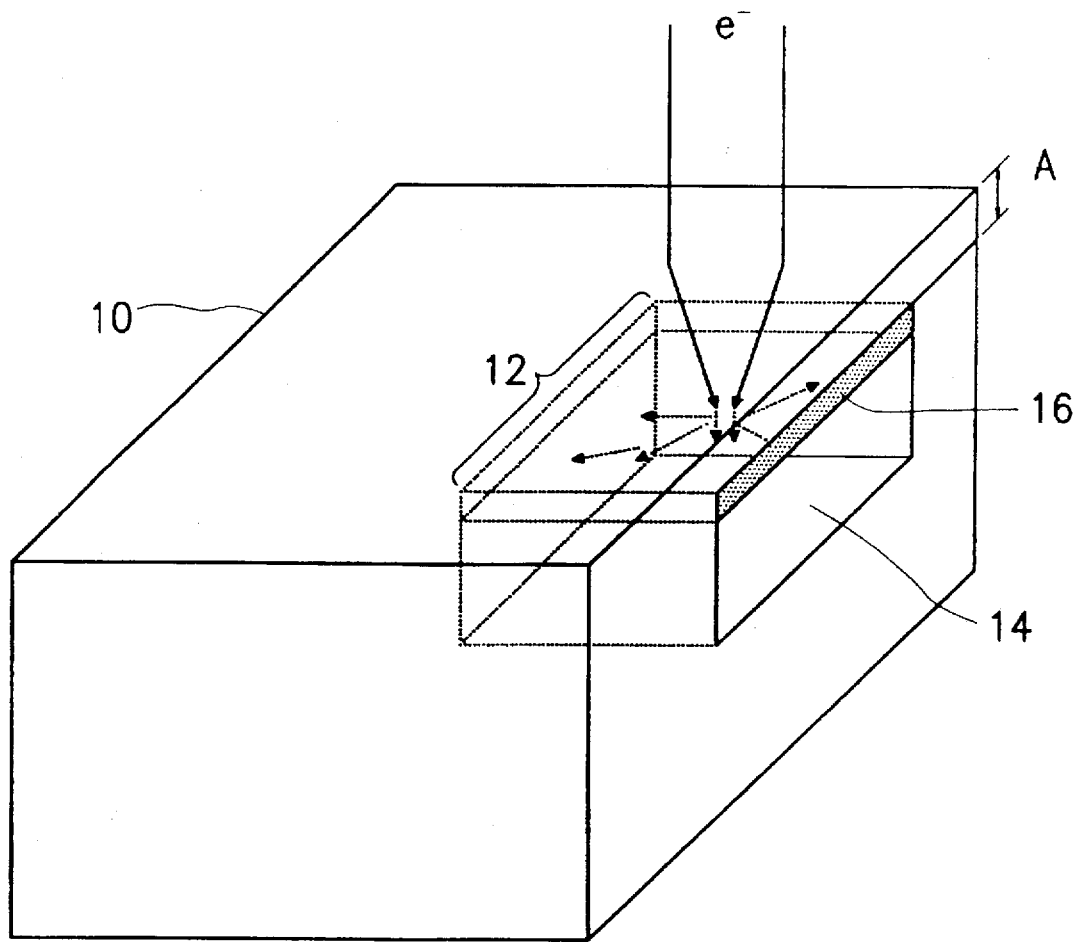
FIG. 1 is a schematic diagram used to depict how the off-line embodiment of the method of the invention is utilized by a charged-particle microscope for inspecting a sample of IC chip.

Referring to FIG. 1, a sample of IC chip 10, after being treated by the cleaving/sawing/grinding and polishing processes, is selected for inspection by a charged-particle microscope (not shown). A target area 12 is outlined on the top surface of the IC chip sample 10; and a cavity 14 is formed beneath the target area 12 by a conventional etching process, such as the focused ion-beam (FIB) etching process. The FIB etching process is a well-known technique so that description thereof will not be further detailed. The cavity 14 is separated from the target area 12 by a thickness of A and is substantially equal in horizontal dimensions to the target area 12. The dimension of the thickness A is dependent on the energy of the charged-particle beam from the microscope, which is about 2,000 Å to 5,000 Å (angstroms) for high energy beam.

Further, a coating 16 of good electrical and heat conductive material is formed on the top wall of the cavity 14 (i.e., the opposite surface of the target area 12 over the thickness A). During operation of the charged-particle microscope, a charged-particle beam (designed by $e^-$) is emitted from the microscope (not shown) and strikes the target area 12. After passing through the thickness A, the charged-particle beam subsequently encounters the coating 16 which then allows the charged particles to be drawn away thereby. As a result of this, the adverse consequences of charge effect and thermal damage can be prevented. The coating 16 also allows for increased resolution for the charged-particle image of the IC chip sample 10.

Figure 2:
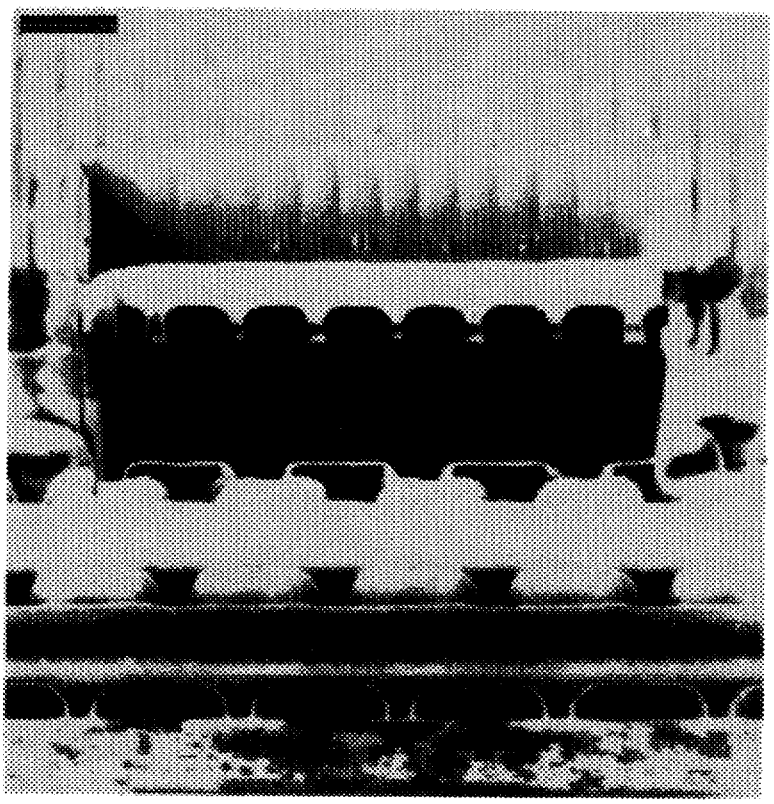
FIG. 2 is a picture, showing a sectional view of part of an IC chip which is not formed with a coating of good electrical and heat conductive material by the method of the invention.
Figure 3:
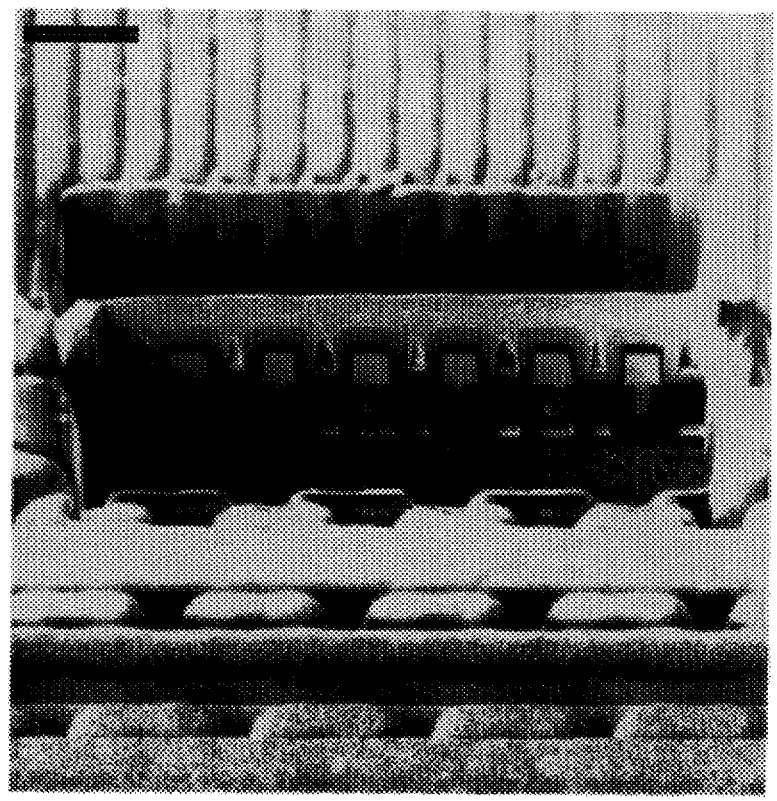
FIG. 3 is a picture, showing a sectional view of part of an IC chip which is formed with a coating of good electrical and heat conductive material by the method of the invention.

FIG. 2 is a picture taken by a charged-particle microscope, which shows a sectional view of part of an IC chip sample which is not formed with the coating 16. For comparison, FIG. 3 shows the same kind of picture of an IC chip sample which is formed with the coating 16 by the method of the invention as described above with reference to FIG. 1. It can be clearly seen that the picture of FIG. 3 is significantly greater in resolution than the picture of FIG. 2. The advantage of the method of the invention is apparent.

Second Preferred Embodiment (On-line/Off-line)

The previous off-line embodiment of the method of the invention is not suitable for use on mass production lines since the cleaving/sawing/grinding and polishing processes should not be conducted in clean rooms which are usually deployed at mass production sites. To allow the method of the invention to be applicable on mass production line where is a clean-room environment, the on-line/off-line embodiment is provided.

Figure 4:
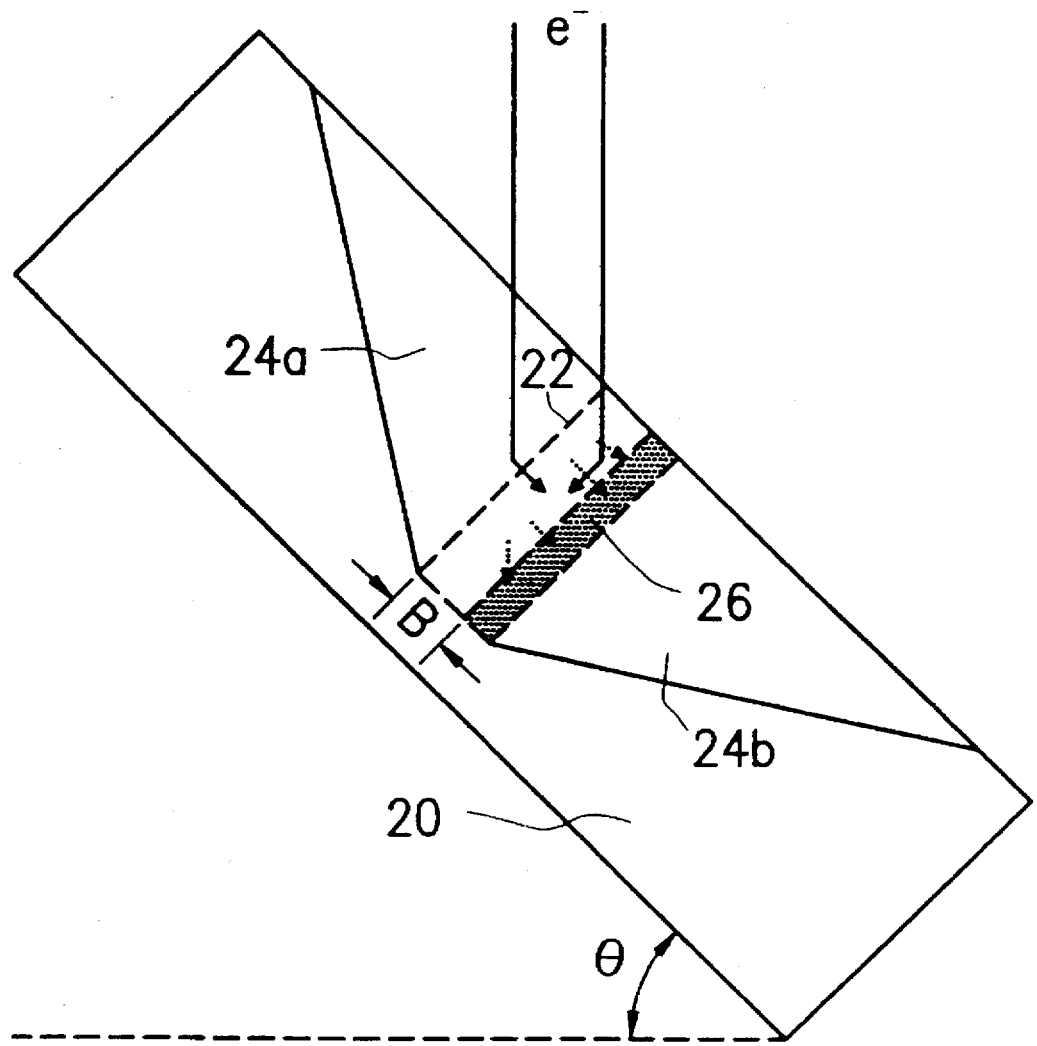
FIG. 4 is a schematic diagram used to depict how the on-line/off-line method of the invention is applied with a microscope specifically utilized on a mass production line to inspect a sample of IC chip.

Referring to FIG. 4, a sample of IC chip 20 is selected for inspection by a charged-particle microscope (not shown). A target portion 22 is defined on the IC chip sample 20, and then the IC chip sample 20 is partly etched away by a conventional etching process, such as the FIB etching process, so as to form a pair of hollowed portions 24a, 24b which are substantially triangularly shaped in cross section and symmetrically formed about the target portion 22.

The target portion 22 has a thickness of B which is about 2,000 Å to 5,000 Å for high energy beam. The target portion 22 has one side surface (i.e., the upright sidewall of the first hollowed portion 24a) that serves as the target surface facing the charged-particle beam (designed by $e^-$ in FIG. 4), and the other side surface (i.e., the upright sidewall of the second hollowed portion 24b) formed with a coating 26 of good electrical and heat conductive material. During operation of the charged-particle microscope, the IC chip sample 20 is oriented at an angle of θ with respect to a horizontal plane perpendicular to the direction of the charged-particle beam from the microscope. This allows the charged-particle beam to pass by way of the first hollowed portion 24a so that it can strike the target surface of the target portion 22.

After striking on and passing through the IC chip sample 20, the charged particles subsequently meet the coating 26 and are thus drawn away by the same, such that the adverse consequences of charge effect and thermal damage can be prevented. The coating 16 also allows for increased resolution of the charged-particle image from the IC chip sample 10.

Other areas of the IC chip sample can be inspected by the same method described above. Since in this method the inspected portion does not have to be cut apart from the chip, said inspection can be conducted in of clean rooms. Therefore, this method is applicable both in mass production lines and laboratories.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for inspecting an IC chip by a charged-particle microscope without incurring charging effect and thermal damage to the chip, the method comprising the steps of:

(1) cutting a portion of the chip as a sample;

(2) outlining a target area on said sample;

(3) forming a cavity beneath said target area, said cavity being dimensioned substantially equal to said target area and separated from said target area by a predetermined thickness, said cavity having a top wall which is opposite to said target area over the thickness;

(4) forming a coating of electrical and heat conductive material on the top wall of said cavity; and (5) orienting said sample in such a manner as to allow a charged-particle beam from the charged-particle microscope to strike said target area and subsequently encounter said coating of electrical and heat conductive material on the top wall of said cavity beneath said target area.

2. The method of claim 1, wherein the thickness is proportional to the kinetic energy of the charged-particle beam.

3. The method of claim 2, wherein said cavity is formed by a focused ion-beam etching process.

4. The method of claim 1, wherein the thickness between said target area and the top wall of said cavity is about 2,000 Å to 5,000 Å.

5. A method for inspecting an IC chip by a charged-particle microscope without incurring charge effect and thermal damage to the chip, said method comprising the steps of:

(1) obtaining a sample of the chip;

(2) defining a target portion on said sample;

(3) forming a pair of hollowed portions on both sides of said target portion, the forming of said pair of hollowed portions allowing said target portion to have a first sidewall and a second sidewall;

(4) forming a coating of electrical and heat conductive material on the second sidewall of said target portion; and (5) orienting said sample by a predetermined angle with respect to the charged-particle beam from the charged-particle microscope in such a manner as to allow the charged-particle beam to strike the first sidewall of said target portion and subsequently encounter said coating of electrical and heat conductive material on the second sidewall of said target portion.

6. The method of claim 5, wherein the target portion has a thickness proportional to the kinetic energy of the charged-particle beam.

7. The method of claim 6, wherein said pair of hollowed portions are formed by a focused ion-beam etching process.

8. The method of claim 6, wherein the thickness of said target portion is about 2,000 Å to 5,000 Å.

* * * * *